(12) United States Patent
Massoud et al.

(10) Patent No.: US 11,777,310 B2
(45) Date of Patent: Oct. 3, 2023

(54) VIRTUAL INERTIA ESTIMATION FOR BLACK-START USING TOWER OF HANOI (TOH) FOR EMERGING ELECTRICITY DISTRIBUTION NETWORKS

(71) Applicant: QATAR UNIVERSITY, Doha (QA)

(72) Inventors: Ahmed Massoud, Doha (QA); Omar Ellabban, Doha (QA); Abdulrahman Alassi, Doha (QA)

(73) Assignee: QATAR UNIVERSITY, Doha (QA)

( * ) Notice: Subject to any disclaimer, the term of this patent is extended or adjusted under 35 U.S.C. 154(b) by 124 days.

(21) Appl. No.: 17/585,072

(22) Filed: Jan. 26, 2022

(65) Prior Publication Data
US 2022/0239097 A1    Jul. 28, 2022

Related U.S. Application Data

(60) Provisional application No. 63/141,742, filed on Jan. 26, 2021.

(51) Int. Cl.
*G05B 15/02* (2006.01)
*H02J 3/00* (2006.01)
*H03L 7/08* (2006.01)

(52) U.S. Cl.
CPC .............. *H02J 3/001* (2020.01); *G05B 15/02* (2013.01); *H03L 7/08* (2013.01)

(58) Field of Classification Search
CPC .......... B60B 7/068; G06F 30/27; G05B 15/02
See application file for complete search history.

(56) References Cited

PUBLICATIONS

Zhao "Optimization of Zone Partitioning for Active Distribution Network Black-Start Based on MILP" from "2019 IEEE Power & Energy Society General Meeting (PESGM)" (Year: 2019).*
Panda "Online Estimation of System Inertia in a Power Network Utilizing Synchrophasor Measurements" from "IEEE Transactions on Power Systems. vol. 35, No. 4. Jul. 2020" (Year: 2020).*
Golshani "Advanced power system partitioning method for fast and reliable restoration: toward a self-healing power grid" from "IET Gener. Transm. Distrib., 2018, vol. 12 Iss. 1, pp. 42-52" (Year: 2018).*
Islam "An Approach towards Developing Tower of Hanoi Sequence Based Distributed Multi-Channel Parallel Rendezvous for Ad Hoc Networks" from "2018 IEEE International Conference on Innovative Research and Development (ICIRD)" (Year: 2018).*
World Energy Outlook 2017, International Energy Agency, iea.org/weo/, pp. 1-300 (316 pages).

(Continued)

*Primary Examiner* — Yuhui R Pan
(74) *Attorney, Agent, or Firm* — SQUIRE PATTON BOGGS (US) LLP

(57) ABSTRACT

A method for managing a microgrid network under a blackout condition. The method may include partitioning the microgrid network into a plurality of clusters. The method may also include determining a virtual inertia value for each of the plurality of clusters. The method may further include classifying the plurality of clusters based on corresponding virtual inertia values. In addition, the method may include performing a black-start operation by employing a Tower of Hanoi concept to restore power to the microgrid network. According to certain embodiments, performance of the black-start operation may take into account the virtual inertial values.

15 Claims, 12 Drawing Sheets

(56) References Cited

PUBLICATIONS

World Energy Outlook 2017, International Energy Agency, iea.org/weo/, pp. 301-520 (220 pages).

World Energy Outlook 2017, International Energy Agency, iea.org/weo/, pp. 521-763 (246 pages).

Mahdi Ashabani et al., IEEE Transactions on Smart Grid, vol. 7, No. 3, May 2016, "Inducverters: PLL-Less Converters With Auto-Synchronization and Emulated Inertia Capability", 15 pages, DOI: 10.1109/TSB.2015.2468600, http://www.ieee.org/publications_standard/publications/rights/index.html.

Julia Matevosyan et al., "Grid-Forming Inverters", IEEE Power and Energy Magazine, Nov./Dec. 2019, 10 pages.

Paul Vincent Brogan et al., "Effect of BESS Response on Frequency and RoCoF During Underfrequency Transients", IEEE Transaction on Power Systems, vol. 34, No. 1, Jan. 2019, 9 pages, DOI: 10.1109/TPWRS.2018.2862147, http://www.ieee.org/publications_standards/publications/rights/index.html.

Georgios Patsakis et al., "Optimal Black Start Allocation for Power System Restoration", IEEE Transactions on Power Systems, vol. 33, No. 6, Nov. 2018, 11 pages, DOI: 10.1109/TPWRS.2018.2839610, http://www.ieee.org/publications_standards/publications/rights/index.html.

Robert H. Lasseter et al., "Grid-Forming Inverters: A Critical Asset for the Power Grid", IEEE Journal of Emerging and Selected Topics in Power Electronics, vol. 8, No. 2, Jun. 2020, 11 pages, DOI: 10.1109/JESTPE.2019.2959271, http://ieee.org/publications/rights/index.html.

Arwindra Rizqiawan et al., "Development of Grid-Connected Inverter Experiment Modules for Microgrid Learning", Energies 2019, 12, 476, 16 pages, DOI: 10.3390/en12030476, www.mdpi.com/journal/energies.

Donghua Pan et al., "Transient Stability of voltage-Source Converters With Grid-Forming Control: A Design-Oriented Study", IEEE Journal of Emerging and Selected topics in Power Electronics, vol. 8, No. 2, Jun. 2020, 15 pages, DOI: 10.1109/JESTPE.2019.2946310, https://www.ieee.org/publications/rights/index.html.

Junru Chen et al., "Use of Voltage Limits for Current Limitations in Grid-Forming Converters", CSEE Journal of Power and Energy Systems, vol. 6, No. 2, Jun. 2020, 11 pages, DOI: 10.17775/CSEEJPES.2019.02660.

Eirgrid Soni, "RoCof Alternative & Complementary Solutions Project, Phase 2 Study Report", Mar. 31, 2016, 100 pages.

Bala Kameshwar Poolla et al., "Placement and Implementation of Grid-Forming and Grid-Following Virtual Inertia and Fast Frequency Response", IEEE Transactions on Power Systems, vol. 34, No. 4, Jul. 2019, 12 pages, DOI: 10.1109/TPWRS.2019.2892290, http://www.ieee.org/publications_standards/publications/rights/index.html.

Roberto Rosso et al., "Robust Stability Investigation of the Interactions Among Grid-Forming and Grid-Following Converters", IEEE Journal of Emerging and Selected Topics in Power Electronics, vol. 8, No. 2, Jun. 2020, 13 pages, DOI: 10.1109/JESTPE.2019.2951091, https://www.ieee.org/publicaitons/rights/index.html.

Ali Tayyebi et al., "Frequency Stability of Synchronous Machines and Grid-Forming Power Converters", IEEE Journal of Emerging and Selected Topics in Power Electronics, vol. 8, No. 2, Jun. 2020, 15 pages, DOI: 10.1109/JESTPE.2020.2966524, https://www.iee.org/publications/rights/index.html.

Jingyang Fang et al., "Distributed Power System Virtual Inertia Implemented by Grid-Connected Power Converters", IEEE Transactions on Power Electronics, vol. 33, No. 10, Oct. 2018, 12 pages, DOI: 10.1109/TPEL.2017.2785218, http://www.IEEE.org/publications_standards/publications/rights/index.html.

Kiaochao Hou et al., "Distributed Hierarchical Control of AC Microgrid Operating in Grid-Connected, Islanded and Their Transition Modes", IEEEAccess, published Nov. 21, 2018, date of current version Dec. 31, 2018, 14 pages, DOI 10.1109/ACCESS.2018/2882678, http://www.ieee.org/publications_standards/publications/rights/index.html.

Hassan Bevrani et al., Electrical Power and Energy Systems, "Virtual synchronous generators: A Survey and new perspectives", Electrical Power and Energy Systems 54 (2014), pp. 244-254, Journal homepage: www.elsevier.com/locate/ijepes, DOI: 10.1016/j.ijepes.2013.07.009, 11 pages.

Qing-Chang Zhong et al., "Self-Synchronized Synchronverters: Inverters Without a Dedicated Synchronization Unit", IEEE Transactions on Power Electronics, vol. 29, No. 2, Feb. 2014, 14 pages, DOI: 10.1109/TPEL.2013.2258684.

Shuan DONG et al., "Adjusting Synchronverter Dynamic Response Speed via Damping Correction Loop", IEEE Transactions on Energy Conversion, vol. 32, No. 2, Jun. 2017, 12 pages, DOI: 10.1109/TEC.2016.2645450.

Weiyi Zhang et al., "Frequency Supoprt Characteristics of Grid-Interactive Power Converters Based on The Synchronous Power controller", IET Renewable Power Generation, 2017, vol. 11, Iss. 4, pp. 470-479, IET Journals, The Institution of Engineering and Technology, 10 pages, DOI: 10.1049/iet-rpg.2016.0557, www.ietdl.org.

Yiwei MA et al., "Virtual Synchronous Generator Control of Full Converter Wind Turbines With Short-Term Energy Storage", IEEE Transactions on Industrial Electronics, vol. 64, No. 11, Nov. 2017, 11 pages, DOI: 10.1109/TIE.2017.2694347, http://www.iee.org/publications_standards/publications/rights/index.html.

Jingyang Fang et al., "A Battery/Ultracapacitor Hybrid Energy Storage System for Implementing the Power Management of Virtual Synchronous Generators", IEEE Transactions on Power Electronics, vol. 33, No. 4, Apr. 2018, 5 pages, DOI: 10.1109/TPEL.2017.2759256, http://www.ieee.org/publications_standards/publications/rights/index.html.

Eneko Unamuno et al., "Impedance-Based Stability Evaluation of Virtual Synchronous Machine Implementations in Converter Contorllers", The 2018 International Power Electronics Conference, 8 pages.

Xue Cao et al., "Evaluation of the Impact of Variable System Inertia on the Performance of Frequency Based Protection", Institute for Energy and Environment, University of Strathclyde, Glasgow, UK, 6 pages, downloaded on Jan. 13, 2022.

Kai Shi et al., "Low-Voltage Ride Through Control Strategy of Virtual Synchronous Generator Based on the Analysis of Excitation State", IET Generation, Transmission & Distribution, IET Journals, The Institution of Engineering and Technology, 8 pages, DOI: 10.1049/iet-gtd.2017.1988, www.ietdl.org.

Junhui Li et al., "Stratified Optimization Strategy Used for Restoration with Photovoltaic-Battery Energy Storage Systems as Black-Start Resources", IEEE Access, vol. 7, 2019, published Aug. 27, 2019, date of current version Sep. 18, 2019, 14 pages, DOI: 10.1109/ACCESS.2019.2937833, http://creativecommons.org/licenses/by/4.0/.

National Grid ESO, Jun. 2019, Technology Capability and Readiness for Distributed Restoration, Black Start From Non-Traditional Generation Technologies, Network Innovation Allowance Jun. 2019, http://fes.nationalgrid.com/media/1363/fes-interactive-version-final.pdf, 34 pages.

Transformers Magazine, vol. 4, Issue 4, "Transformer Energisation After Network Blackout, Impact on Network Restoration and Improvement of its Process", www.transformers-magazine.com, 5 pages.

Fouad B. Chedid et al., Correspondence, "A Simple Interactive Algorithm for the Towers of Hanoi Problem", IEEE Transactions on Education, vol. 39, No. 2, May 1996, Publisher Item Identifier: S 0018-9359(96)04250-1, 2 pages.

Md. Rafiqul Islam et al., "An Approach Towards Developing Tower of Hanoi Sequence Based Distributed Multi-Channel Parallel Rendezvous for Ad Hoc Networks", 2018 IEEE International Conference on Innovative Research and Development (ICIRD) May 11-12, 2018, Bangkok, Thailand, 6 pages.

Jinquan Zhao et al., "Optimization of Zone Partitioning for Active Distribution Network Black-Start Based on MILP", 5 pages.

Roman Bazylevych et al., "Power System Islanding by the Hierarchical Clustering", CSIT 2019, Sep. 17-20, 2019, Lviv, Ukraine, 4 pages.

(56) References Cited

PUBLICATIONS

Xiao Xin et al., "A Simulated Annealing Genetic Algorithm for Urban Power Grid Partitioning Based on Load Chracteristics", 2019 International Conference on Smart Grid and Electrical Automation (ICSGEA), 5 pages.

Rakesh Kumar Panda et al., "Online Estimation of System Inertia in a Power Network Utilizing Synchrophasor Measurements", IEEE Transactions on Power System, vol. 35, No. 4, Jul. 2020, 11 pages, DOI: 10.1109/TPWRS.2019.2958603, https://www.IEEE.org/publications/rights/index.html.

Amir Golshani et al., "Advanced Power System Partitioning Method for Fast and Reliable Restoration: Toward a self-healing power grid", IET Generation, Transmission and Distribution, IET Journals, The Institution of Engineering and Technology, 11 pages, DOI: 10.1049/iet-gtd.2016.1797, www.ietdl.org.

Peishuai LI et al., "Distributed Adaptive Robust Voltage/VAR Control With Network Partition in Active Distribution Networks", IEEE Transactions on Smart Grid, vol. 11, No. 3, May 2020, 12 pages, Doi: 10.1109/TSG.2019.2950120, http://www.IEEE.org/publications_standards/publications/rights/index.html.

\* cited by examiner

VIRTUAL INERTIA ESTIMATION FOR BLACK-START USING TOWER OF HANOI (TOH) FOR EMERGING ELECTRICITY DISTRIBUTION NETWORKS

CROSS-REFERENCE TO RELATED APPLICATIONS

This application claims priority from U.S. provisional patent application No. 63/141,742 filed on Jan. 26, 2021. The contents of this earlier filed application are hereby incorporated by reference in their entirety.

FIELD

Some embodiments may generally relate to assistive systems. More specifically, certain embodiments may relate to apparatuses, systems, and/or methods for virtual inertia estimation for black-start using the Tower of Hanoi (ToH) for emerging electricity distribution networks.

BACKGROUND

Global energy is surging, mainly in developing countries due to rapid economic and population growth. Both centralized and distributed renewable energy sources heavily contribute to the required capacity expansion. The grid-integration of many renewable energy sources (RESs) has been traditionally performed using voltage-source converters. Nevertheless, the high proliferation of RESs affects the system inertia and the black starting capability of the distribution network. Therefore, there is a need to find an online inertia estimation approach for power networks that overcome these challenges.

SUMMARY

Certain embodiments may be directed to a method for managing a microgrid network under a blackout condition. The method may include partitioning the microgrid network into a plurality of clusters. The method may also include determining a virtual inertia value for each of the plurality of clusters. The method may further include classifying the plurality of clusters based on corresponding virtual inertia values. In addition, the method may include performing a black-start operation by employing a Tower of Hanoi concept to restore power to the microgrid network. According to certain embodiments, performance of the black-start operation may take into account the virtual inertial values.

Other embodiments may be directed to an apparatus for managing a microgrid network under a blackout condition. The apparatus may include at least one processor, and at least one memory including computer program code. The at least one memory and the computer program code may be configured to, with the at least one processor, cause the controller at least to partition the microgrid network into a plurality of clusters. The apparatus may also be caused to determine a virtual inertia value for each of the plurality of clusters. The apparatus may further be caused to classify the plurality of clusters based on corresponding virtual inertia values. In addition, the apparatus may be caused to perform a black-start operation by employing a Tower of Hanoi concept to restore power to the microgrid network. According to certain embodiments, performance of the black-start operation may take into account the virtual inertial values.

Other embodiments may be directed to a computer program, embodied on a non-transitory computer readable medium. The computer program, when executed by a processor, may cause the processor to partition a microgrid network under a blackout condition into a plurality of clusters. The processor may also be caused to determine a virtual inertia value for each of the plurality of clusters. The processor may further be caused to classify the plurality of clusters based on corresponding virtual inertia values. In addition, the processor may be caused to perform a black-start operation by employing a Tower of Hanoi concept to restore power to the microgrid network. According to certain embodiments, performance of the black-start operation may take into account the virtual inertial values.

BRIEF DESCRIPTION OF THE DRAWINGS

The accompanying drawings, which are included to provide a further understanding of the invention and are incorporated in and constitute a part of this specification, illustrate preferred embodiments of the invention and together with the detail description serve to explain the principles of the invention. In the drawings.

DETAILED DESCRIPTION

Figure 1:
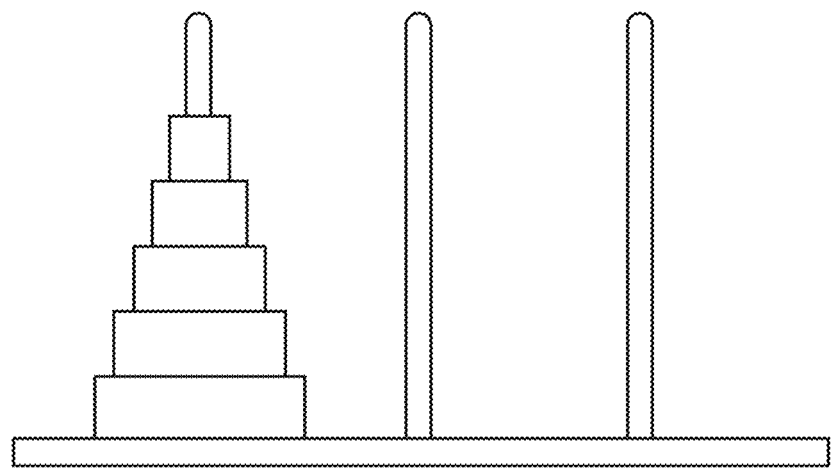
FIG. 1 illustrates an example display of a towers of Hanoi game.

It will be readily understood that the components of certain example embodiments, as generally described and illustrated in the figures herein, may be arranged and designed in a wide variety of different configurations. The following is a detailed description of some embodiments for removing smoke from the exhaust of engines such as, for example, diesel engines.

The features, structures, or characteristics of example embodiments described throughout this specification may be combined in any suitable manner in one or more example embodiments. For example, the usage of the phrases "certain embodiments," "an example embodiment," "some embodiments," or other similar language, throughout this specification refers to the fact that a particular feature, structure, or characteristic described in connection with an embodiment may be included in at least one embodiment. Thus, appearances of the phrases "in certain embodiments," "an example embodiment," "in some embodiments," "in other embodiments," or other similar language, throughout this specification do not necessarily all refer to the same group of embodiments, and the described features, structures, or characteristics may be combined in any suitable manner in one or more example embodiments.

Additionally, if desired, the different functions or steps discussed below may be performed in a different order and/or concurrently with each other. Furthermore, if desired, one or more of the described functions or steps may be optional or may be combined. As such, the following description should be considered as merely illustrative of the principles and teachings of certain example embodiments, and not in limitation thereof.

As noted above, global energy demand is surging. Specifically, global production may be expected to reach 38,000 TWh in 2040 from 24,000 TWh in 2016, with renewables contributing to 51% of the generation mix by 2040. On the other hand, traditional electricity networks may be characterized by unidirectional power flow from distant generation sites to remote load areas. However, increased penetration of renewable energy sources may make it necessary to adapt classical electricity network models in order to accommodate, control, and manage bidirectional energy flow. This model adaption may be needed given the intermittent nature of solar and wind energy sources.

According to certain embodiments, the grid-integration of many RES (e.g., wind and solar photovoltaic (PV)) may have been traditionally performed using voltage-source converters. Taking solar PV as an example, the classical model may have been to extract the maximum power through a DC-DC converter and to control the grid-interface inverter with dual-loop (outer voltage and inner current) structure. The outer loops may maintain a constant DC link at the set value and may provide the inner loop with reference active/reactive currents in the synchronous dq frame, which may ensure a protection functionality as well in terms of limiting the maximum current reference the converter can handle to avoid damaging the equipment. The inner current loop consequently may track the reference current and may generate the PWM reference dq voltages that may be used to drive the inverter (typically with sinusoid or space-vector PWM). However, assigning the control objective of the outer voltage loop to maintaining a constant DC link voltage may have meant that the output AC voltage of the inverter is left uncontrolled. For that, the adopted practice may be to follow the grid voltage as a "stiff" voltage source and to lock-up to its voltage waveform using a synchronization tool. The most widely used tool for this purpose may be phase-locked-loop (PLL), which may have served two objectives in this context: 1) aligning the inverter output voltage to the grid voltage; and 2) providing the reference angle to the abc-dq transformations that may be needed for the above-discussed dual-loop control structure.

The described system may be termed "grid-following" converter because it may need a stiff-voltage source to synchronize to and follow. For a strong network with a high synchronous generators ratio (high spinning reserve), the grid-following technique may have performed reasonably well for the primary grid-integration objective of VSCs utilization as energy conversion and supply equipment. However, the increased penetration of converter-based generation may have led to a decrease in system strength (inertia). This may have created several issues with effects that are increasing as long as the traditional control assumptions are maintained because: 1) PLLs may be shown to perform poorly when connected to weak networks, which may increase the likelihood of their loss of grid-synchronization leading to converter instability and tripping; or 2) The decreased overall system inertia may mean that the inertial response to system disturbances is also affected (i.e., increasing the rate-of-change-of-frequency (RoCoF) and the frequency minimum point (nadir)).

In severe cases, the minimum frequency can go below the minimum value allowed by grid codes and may activate the under-frequency protection devices. Classical grid-following converters may not be inherently equipped with frequency response controllers, and thus under the scenario of having a very high grid-following RES penetration (e.g., +60%), which may already happening in different locations in terms of instantaneous RES penetration, the network stability may become at stake unless expensive additional synchronous condensers are installed for the purpose of network support. Similarly, the participation of grid-following controlled voltage source converters (VSCs) in network-restoration after a system blackout may be limited, and may need an external source to energize first in order for them to "follow". This may be why converter-based RES are needed to remain disconnected during network restoration by different grid-codes in order to alleviate any additional problems that may result from their output intermittency and continuous maximum-power-point-tracking (MDPT) operation, which may have amplified effects on the already-weak network during restoration. In some cases, the introduction of operating-point based reserve for wind and PV farms by intentionally operating them below the maximum power points in order to maintain a reserve that can be used for grid-frequency support functions when needed have been investigated. This may develop a need for accurate weather forecast models to achieve stable operation, while also taking into account that such techniques may ultimately curtail clean available energy, which may be an undesirable outcome.

Certain embodiments may provide for virtual inertia and black starting of a distribution network using ToH. Additionally, certain embodiments may support virtual inertia for black start capability. Certain embodiments may further have wide applicability, including for utility companies. Certain embodiments may also provide for inertia estimation for black starting capability using the ToH for emerging electricity distribution networks.

As for electricity networks containing high penetration of renewable energy sources, their inertia may be decreased and may become more variable, as described earlier. This may lead to a low and markedly time-varied inertia power system, which may become more sensitive to disturbances and can lead to a loss of network stability easily, causing a system blackout. During a post-blackout system restoration event, partitioning (sectionalizing) the power system into several zones (maintainable islands) with the minimization of the number of connections between them and initiating the parallel restoration independently (as a bottom-up restoration approach) may speed up the recovery process. The partitioning problem can be formulated as a multi-objective, non-linear, non-continuous optimization problem, which may identify proper partitioning points to split the large power grids into multiple clusters (with a similar restoration capability) while satisfying a set of recovery constraints. Several clustering approaches may have been investigated in literature, such as the fuzzy clustering approach, tabu search, Genetic Algorithm, game theory, mixed-integer linear programming (MILP), graph spectra, etc.

The inertia of a power system, which may be a factor in determining the initial dynamics behavior of the system after disturbances, affects the rate of change of frequency (RoCoF) following a system event. Therefore, certain embodiments may provide continuous monitoring of system inertia to take the necessary control action. Several methods have been presented for power system inertial estimation. However, these are not suitable for online inertia estimation. Therefore, certain embodiments may provide an online inertia estimation approach for power networks that overcomes this challenge.

To maximize the benefits from the virtual inertia capability of the GFC control algorithms to support the network restoration during black start events, certain embodiments may provide an online inertia estimation algorithm to cluster the network into maintainable islands using the ToH sequence. This may initiate a bottom-up restoration sequence to speed up the recovery process after a large blackout.

Certain embodiments may provide a virtual inertia estimation for black-start using the ToH for emerging electricity distribution networks. This unified control technique and network clustering algorithm for black-start and virtual inertia provision applications may speed up the deployment rate of renewable energy sources through exploiting the capabilities of their interface converters in alleviating the network weakening effect of traditional grid-following controllers.

Grid-Forming Converters Control (GFCs)

Certain example embodiments may provide an alternative to grid-following converters that are being heavily investigated in literature, and may update the VSC controllers in order to be able to actively participate in grid-support under normal operating conditions, as well as during network restoration. This trend may have given rise to "grid-forming" control of VSCs, termed (GFC). As opposed to the current-source operation of grid-following converters, a control objective of a GFC may be to operate as a voltage source that is able to create and maintain grid-compliant voltage and frequency at its terminals. A variety of techniques may be provided to achieve GFC operation.

Some basic GFC controllers may be similar (in terms of the dual-loop cascaded voltage-current controller structure) to the vector-control used in grid-following control. However, the DC-link voltage control in this configuration may be assigned to a secondary converter (e.g., DC-DC converter for storage interface to DC-link). This way, the outer voltage loop of the inverter may be assigned the task of output AC voltage control. Yet, a PLL may still be needed to generate the reference signal, which may be synthesized digitally with an adjustable reference angle to be matched when/if needed with the point of common coupling (PCC) voltage upon grid-connection (for the grid-synchronization stage). In some embodiments, this technique may be tested in the IBerdrola-Qatar (IBQ) lab.

In certain embodiments, self-synchronizing PLL-Less GFC controllers may rely on output active and reactive power, voltage, and frequency measurements in order to generate inverter terminal voltage and voltage angle signals, which can then be used to drive additional protective internal control loops. According to certain embodiments, the control design equations may depend on active power—frequency and reactive power—voltage droop characteristics, and may incorporate additional blocks for inertia emulation in order to introduce a similar behavior to that of a synchronous machine to the converter. There may be a performance comparison of four grid-forming control techniques and may classify them into inertial and non-inertial control techniques. Though, in some cases, utilizing saturation blocks that are typical in current controllers in grid-following converters to limit their maximum current may lead to practical stability problems in case of faults.

Some embodiments may provide analyses that demonstrate how grid-forming converters can move to the instability operation region of the power-angle curve when rigid current saturation is utilized (i.e., imposing current source behavior on the controlled voltage source). Additionally, there may be use of an adaptive current control mechanism based on voltage limits definition. Certain embodiments may highlight the converter level challenges of grid-forming controllers as a promising, yet challenging technique, in terms of protection and performance robustness (voltage and frequency stability and grid-support through virtual inertia provision). That is, according to some embodiments, converters may be programmable devices that are able, if well controlled, to exceed the performance of physically-limited synchronous generators in inertia provision from a power-systems point of view. This may highlight a scenario whereby converters emulated inertia for a 360 MW energy storage may be able to mimic the same behavior of 3,000 MW of synchronous generators, achieving significant annual savings. That is, power system studies can highlight the potential benefits of pushing the converters control technology to its limits. Whereas additional work may be needed on GFCs converter level control in order to be able to meet such goals.

According to certain embodiments, another level of control may include the interactions between different co-existing large-scale controllers within the grid, along with existing synchronous generators. In reality, different converter manufacturers may adopt different controllers to achieve utility connection needs. For instance, these may include the interactions between grid-forming and grid-following converters in terms of their optimal placement within the network, and studying the dynamic interactions following different system disturbance between a synchronverter GFC with virtual inertia capability and a PLL-based grid-following converter operating in close proximity. Also recently, there may have been an investigation of the interactions between 4 different grid forming techniques (droop, dVOC, matching, and virtual synchronous machine (VSM)) with and without the existence of synchronous generation using the IEEE 9-bus test system. The study showcased that a controller selection for a satisfactory AC side performance may not yield similar results for DC side disturbance (i.e., matching control performed better with DC side disturbances compared to superior performance for VSM control against AC side frequency events). This may show the importance of studying the link between the DC side dynamics and the AC side control objectives in order to achieve a global control objective that maintains stability against disturbances in both sides of operation, when utilizing the analogous operation of the DC link capacitor as a source of inertial support.

In certain embodiments, power-sharing among co-existing converters and generation assets may be useful in order to minimize set-point mismatches and steady-state errors during a network restoration sequence. For instance, a common power-sharing and voltage/frequency stability technique in networks with high converters-based generation may be achieved by applying droop control, which may have the capability of mimicking the behavior of a synchronous generator. However, conventional droop control may have some weaknesses in its practical applications at different voltage levels (e.g., based on its generic X/R ratio assumptions), such as inaccurate power-sharing and frequency deviations after a disturbance, poorly controlled grid-injected power flow in grid-connected mode. Some modification may be proposed to overcome the above drawbacks of the conventional droop control algorithm. However, each research may compensate a narrow range of limitations rather than providing a holistic solution. Furthermore, the droop control for converters-based networks may lack a systematic perspective that optimally operates in needed and important operation modes of grid-connected VS Cs.

Virtual Synchronous Machine (VSM)

A virtual synchronous machine (VSM) may be a type of power converter controller that mimics the behavior of the synchronous machine (SM) in different levels of detail. VSM converter controllers may control a grid interfacing converter in numerous applications such as renewable power, high-voltage direct current (HVDC) links, and microgrids. Compared to traditional and standard vector control, VSM can provide inertia and damping to the system without any extra loop, similar to a traditional synchronous machine. In VSM, the amount of damping and inertia may not depend on the physical properties of the converter as it can be selected by controlling the values of the controller gain. The element (wind turbine, PV system, etc.) that the converter interfaces might not have enough inertia to support the inertia, and an external energy source might be needed to provide the desired inertia and damping. VSM allows an inherent inertia response, grid forming capability (black-start other features, as well as grid forming, may be needed to provide black start) and PLL-less synchronization, among other advantages. The costs for this may be higher current rated power electronics, energy storage needs, and a more interactive control scheme concerning traditional low-frequency power system dynamics.

There may be two main families of VSM. For instance, there may be a VSM based on the synchronous machine full order model. This VSM controllers' type may mimic the full order model of the SM, including the electrical, mechanical, and electromagnetic equations. Another example may include VSM based on a simplified synchronous machine model. This VSM controllers' type may mimic some of the features of an SM, including the swing equation.

VSC Connected RES as Black-Start Resources

Preliminary results may demonstrate the developed hierarchical controllers and synchronization test scenarios for VSC-based systems in an IBQ lab. These may form the building blocks to focus on higher-level objectives of grid-connected renewables control for ancillary services provision. Although rare, the occurrence of a system-level cascaded blackout may cost the network operators and stakeholders millions of dollars and, thus, developing preventive measures, and quick, robust, restoration techniques may be of high demand by utilities and system operators. This may be given the accelerating shift in generation sources from strong synchronous machines based to power electronic-based renewable resources. Such shift may add more pressure on the network strength and may prompt the need for innovative solutions that utilize DER capabilities.

There may be various approaches to preserve system inertia as a result of increasing distributed energy resource (DER) penetration. Such approaches may include introducing a group of partially-loaded synchronous generators, which may add more cost, and/or operating/controlling the grid-connected converter to act virtually as a synchronous generator (i.e., virtual synchronous generator) by combining both the effect of the storage system and/or energy sored in a capacitor.

Ultimately, the successful utilization of converter-dominated networks for black-start and inertia provision as existing and evolving resources may serve an economic objective. Evidently, existing standards may need thorough revision to accommodate the use of DERs at different voltage levels, taking into account the aggregated performance and capabilities of interconnected smaller units. For instance, the transformers and lines energization during network restoration can be performed using soft-energization from grid-connected converters to avoid the excessive inrush current needs.

Online Virtual Inertia Estimation for Black-Start Using Tower of Hanoi (ToH)

The ToH problem may be a well-known game with three pegs and a pile of n disks of differing widths stacked on one peg such that no disk is on top of a smaller one, as illustrated in FIG. 1. The game objective may be to move all the disks from the left-hand peg to the right-hand peg, subject to the conditions that one disk at a time without placing any disk on top of a smaller one. There may be a channel hopping sequence method using the ToH algorithm for multi-channel rendezvous amongst the secondary users of Cognitive Radio Network (CRN), where they may have assumed that the number of available channels may equal to ToH disks, and they may conclude that the application of ToH may provide a less number of iterations and higher success rate.

To maximize the benefits from the virtual inertia capability of the GFC control algorithms to support the network restoration during black start events, certain embodiments may provide an online inertia estimation algorithm to cluster the network into maintainable islands using the ToH sequence to initiate a bottom-up restoration sequence to speed up the recovery process after a large blackout.

Control Related Activities

Figure 2:
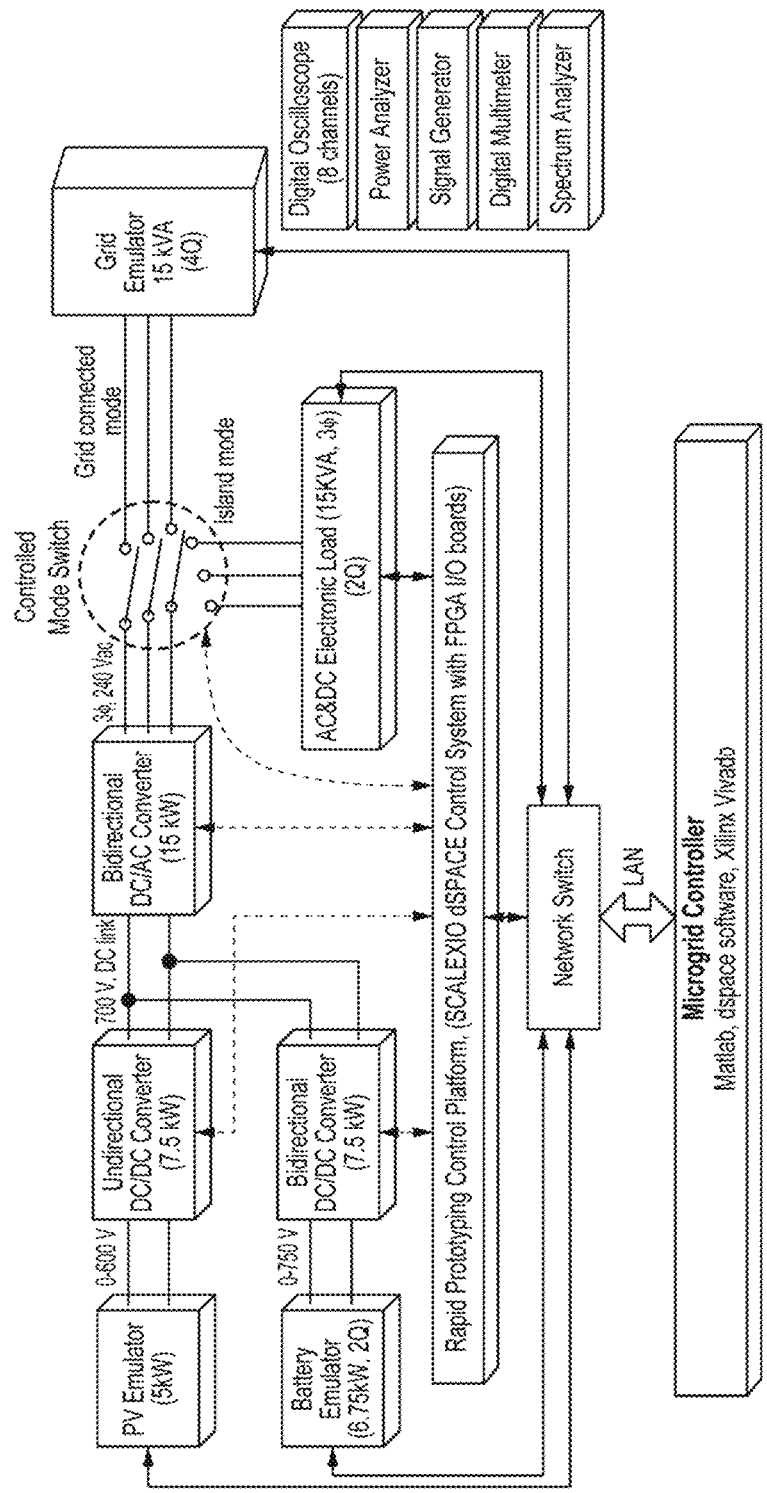
FIG. 2 illustrates an example setup of components, according to certain embodiments.

Certain embodiments may utilize the available experimental setup in IBQ lab, combined with mathematical modeling and MATLAB/Simulink simulation. FIG. 2 illustrates an example setup of components, according to certain embodiments. The achieved work so-far may establish the flexible, full setup operation with complete basic-control blocks for the different system components (DC-DC converters, the bidirectional DC-AC converter) under various operating modes.

Figure 3:
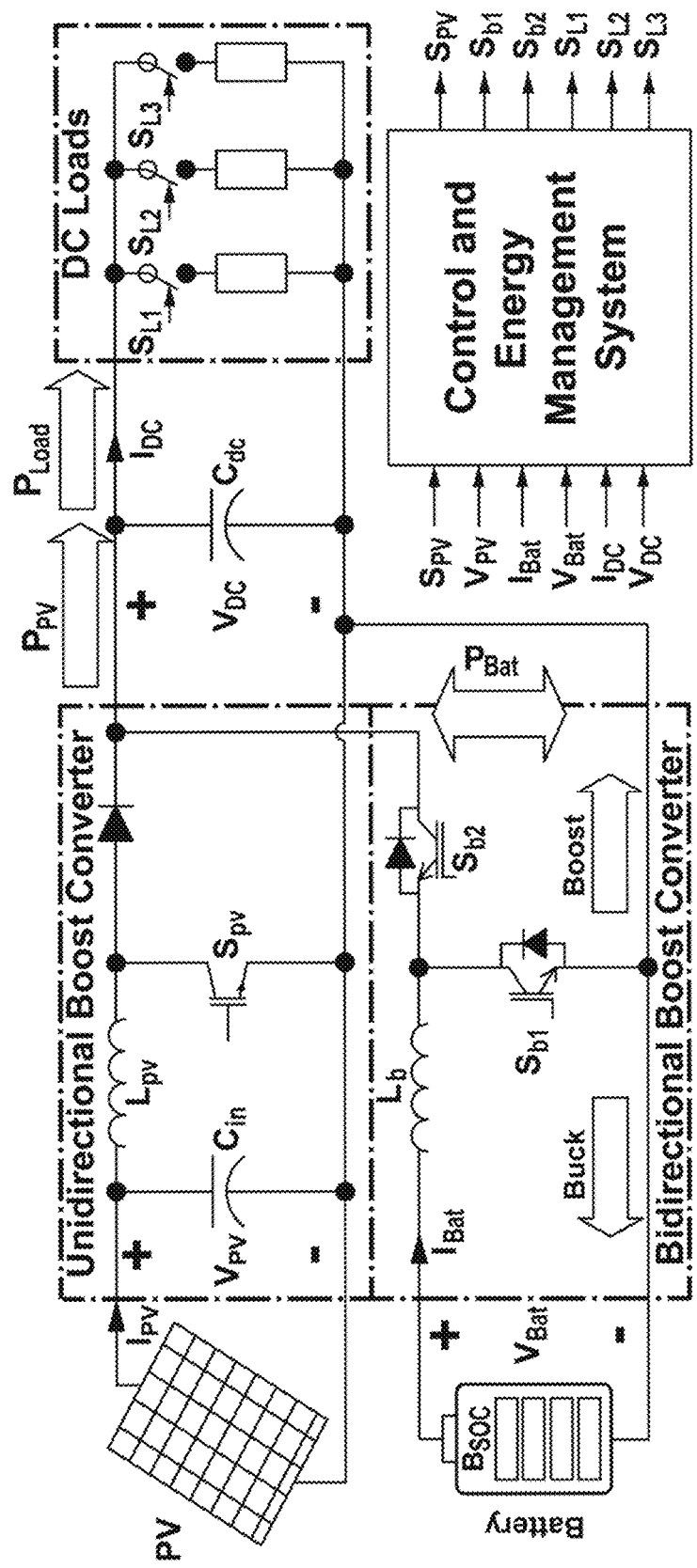
FIG. 3 illustrates an example standalone photovoltaic (PV)/battery direct current (DC) microgrid layout, according to certain embodiments.
Figure 4:
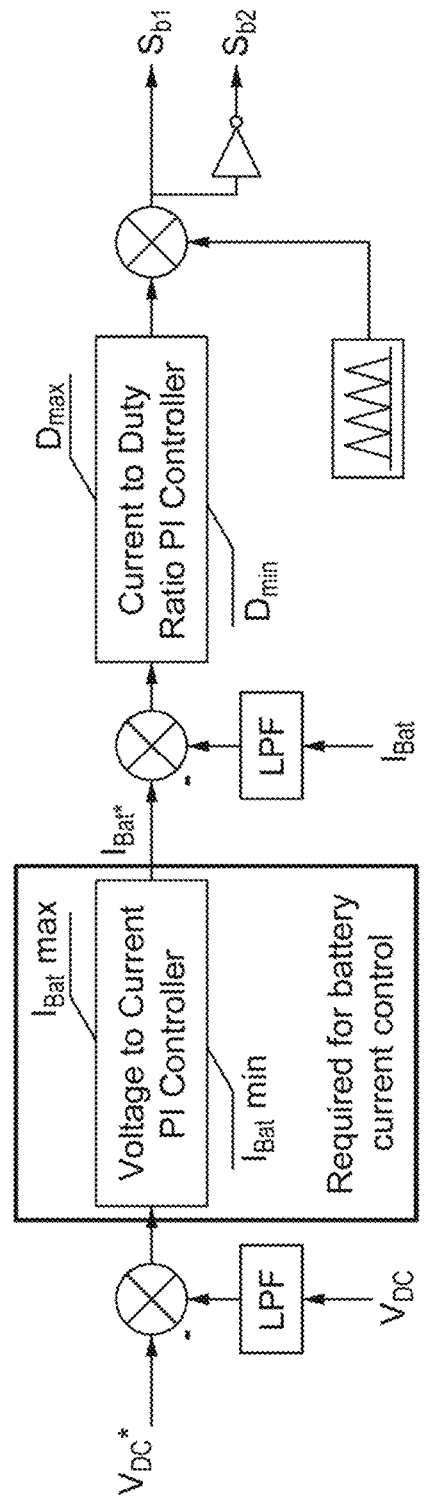
FIG. 4 illustrates an example dual-loop proportional-integral control for a bidirectional boost battery converter, according to certain embodiments.

According to certain embodiments, it may be possible to achieve an intelligent operation of an isolated DC microgrid system consisting of PV, Battery with their converters, a DC link, and switchable loads (FIG. 3). For instance, in certain embodiments, the intelligent operation may include hierarchical control of the DC microgrid with a communication system. The DC link voltage control task may be attributed in its simplest form (proof-of-concept) to a dual-loop PI controller in order to achieve battery charging/discharging current limitation and may maintain the desired DC-link voltage (FIG. 4).

Figure 5A:
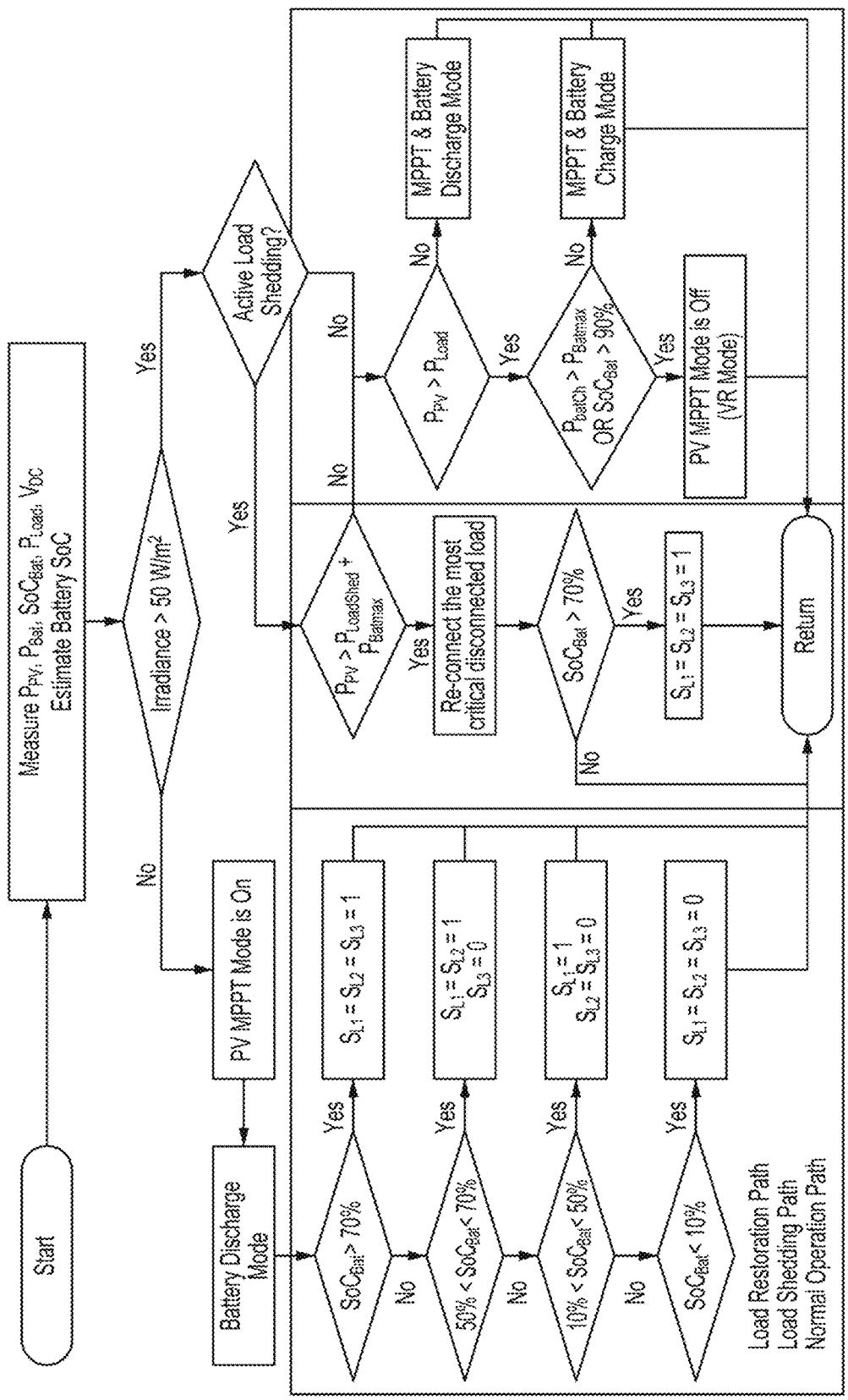
FIG. 5(a) illustrates an example flowchart of an algorithm, according to certain embodiments.
Figure 5B:
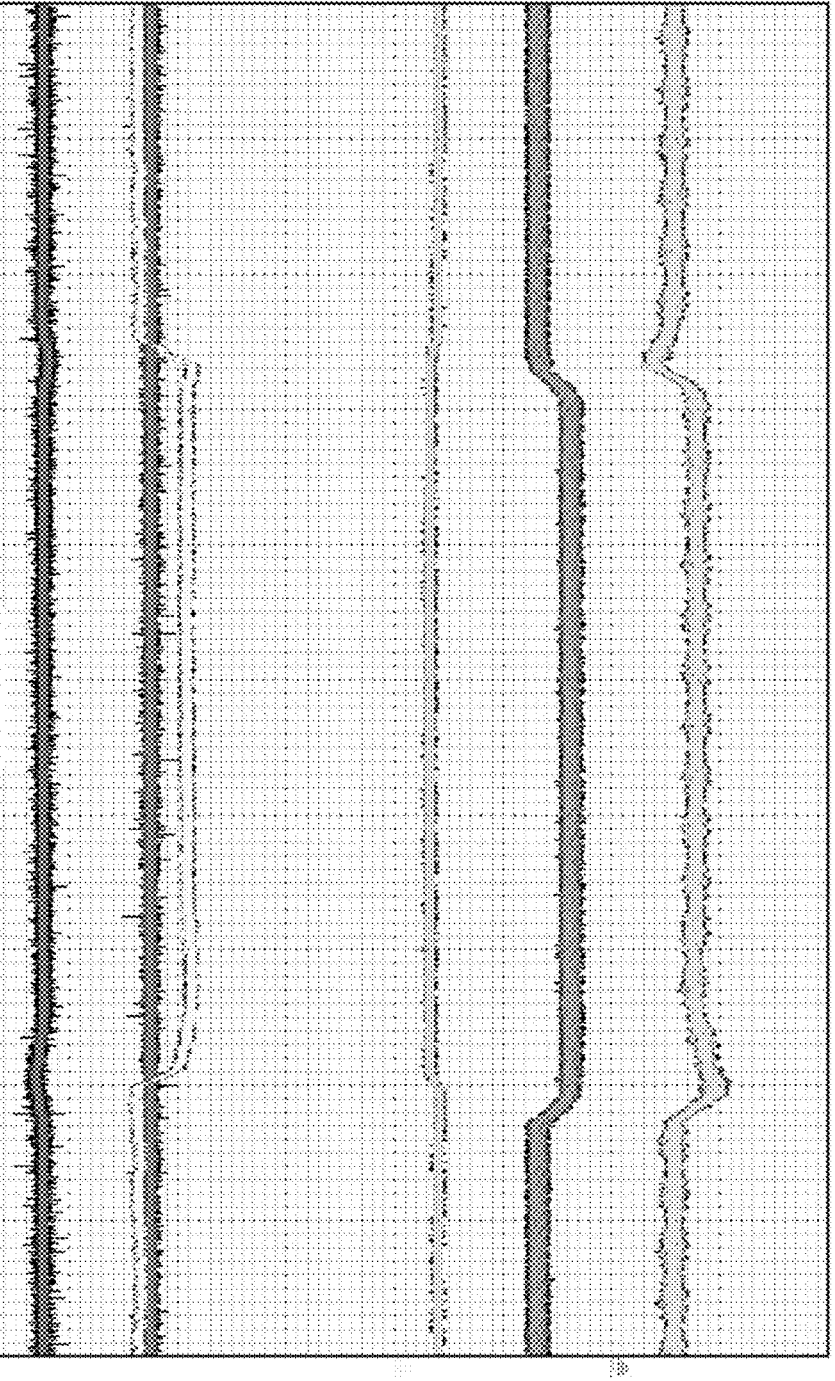
FIG. 5(b) illustrates an example implementation results with multiple PV mode shifts, according to certain embodiments.

According to certain embodiments, the PV converter operating mode may be set to maximum power point tracking (MPPT). Though, it may be desired, in some cases, to alter this operation to allow the converter to participate in the voltage-regulation in case of over-supply and a full battery. Thus, according to certain embodiments, a smart energy management system for the system may be designed and tested experimentally, taking into account partial load shedding/restoration to maintain critical load supply for the longest possible period in an isolated system scenario. FIG. 5(a) illustrates an example flowchart of this algorithm, according to certain embodiments, whereas FIG. 5(b) illustrates an example implementation results with multiple PV mode shifts to maintain constant DC link voltage, according to certain embodiments. In particular, FIG. 5(a) illustrates an intelligent energy management system for a standalone PV/storage DC microgrid. Further, FIG. 5(b) illustrates a PV mode shift from MPPT to VR to MPPT in response to load disturbances (2 kW-1 kW-2 kW). The available signals may include DC voltage, PV voltage, battery voltage, PV current, load current, and battery current.

Figure 5C:
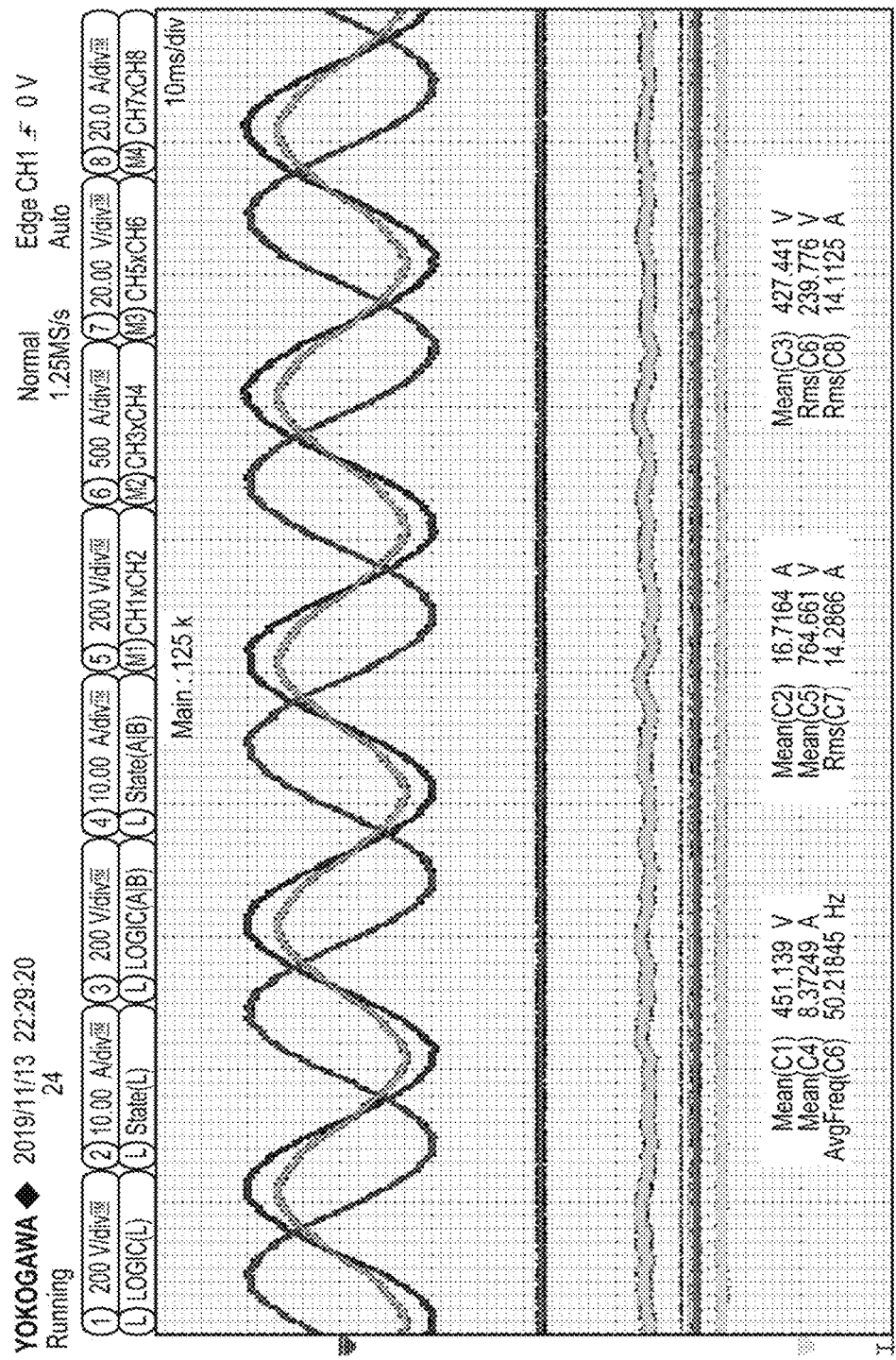
FIG. 5(c) illustrates an example controlled alternating current (AC) microgrid disturbance test with steady-state signals, according to certain embodiments.
Figure 5D:
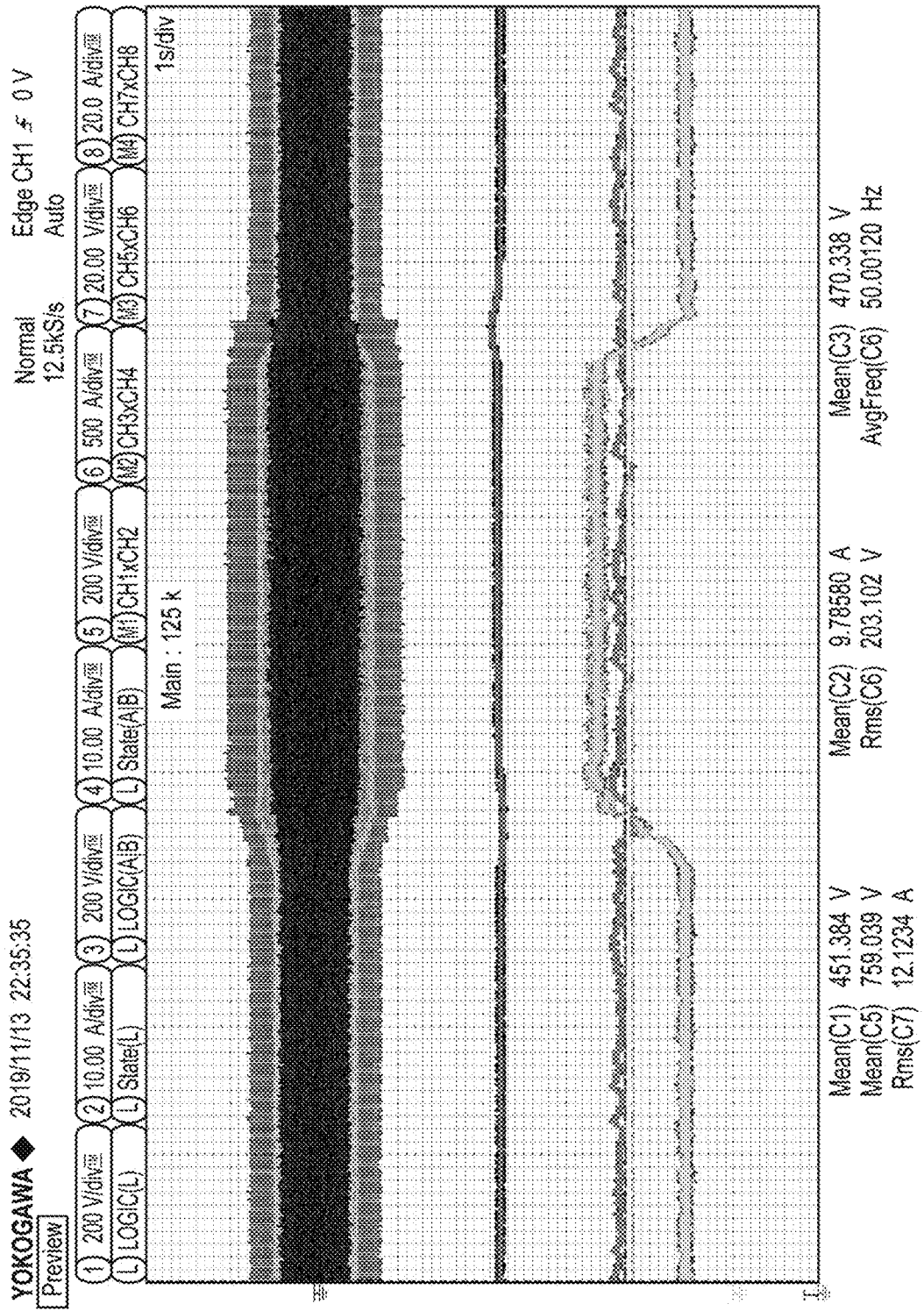
FIG. 5(d) illustrates an example controlled AC microgrid disturbance test with D-axis reference voltage disturbance, according to certain embodiments.

According to certain embodiments, the integrated operation of the DC-side in FIG. 2 may be followed by the integration of the setup AC-side through inverter control. The first task may be to establish an AC island, whereby the control tasks of the DC-DC converters discussed previously were maintained to stabilize the DC link voltage, and the inverter operates in a grid-forming operating mode that supplies the AC load in an islanded microgrid configuration. Cascaded PI loops may be implemented for the inverter in the synchronous (dq) frame, where the reference sinusoid may be digitally generated through the dSPACE controller and tracked via a conventional, PI-based, Phase-Locked-Loop that aims to set the q-frame voltage to zero. The controller may be simulated and tested with satisfactory performance, followed by practical implementation with a rating of 10 kW (FIGS. 5(a)-5(c)). According to certain embodiments, the implemented controller may be verified under various operating conditions and disturbances. For instance, FIG. 5(d) may show the successful tracking of the output sinusoid to a 20% d-axis reference voltage with a minimal effect on the DC link voltage, where the excess needed current may be supplied from the DC-side battery.

The presented results for a grid-forming converter operation may illustrate the capabilities that have been developed and tested at IBQ, which may form strong support to the presented concept. In certain embodiments, the developed controller may have functionalities, which may be aimed to be significantly improved during the course of the proposed project in order to incorporate different important functionalities that may be important to black-start operation such as inertia provision and increased resiliency (e.g., through investigating the DC and AC side limitations and dynamic interactions).

According to certain embodiments, the next step may include developing the synchronization control between the islanded network and the grid. This may involve matching the voltage, frequency, and phase angle between both areas prior to connection (closing synchronization switches, circuit breakers). A simple seamless transition scenario from grid-connected to islanded to grid-connected modes may be successfully tested through MATLAB/Simulink in IBQ lab, and the next step may be to implement it using the experimental setup, which may be equipped with a synchronization box. According to certain embodiments, the synchronization box may be used for seamless connection to the grid by synchronizing the converter with the grid first, and then to connect the converter to the grid.

Figure 6:
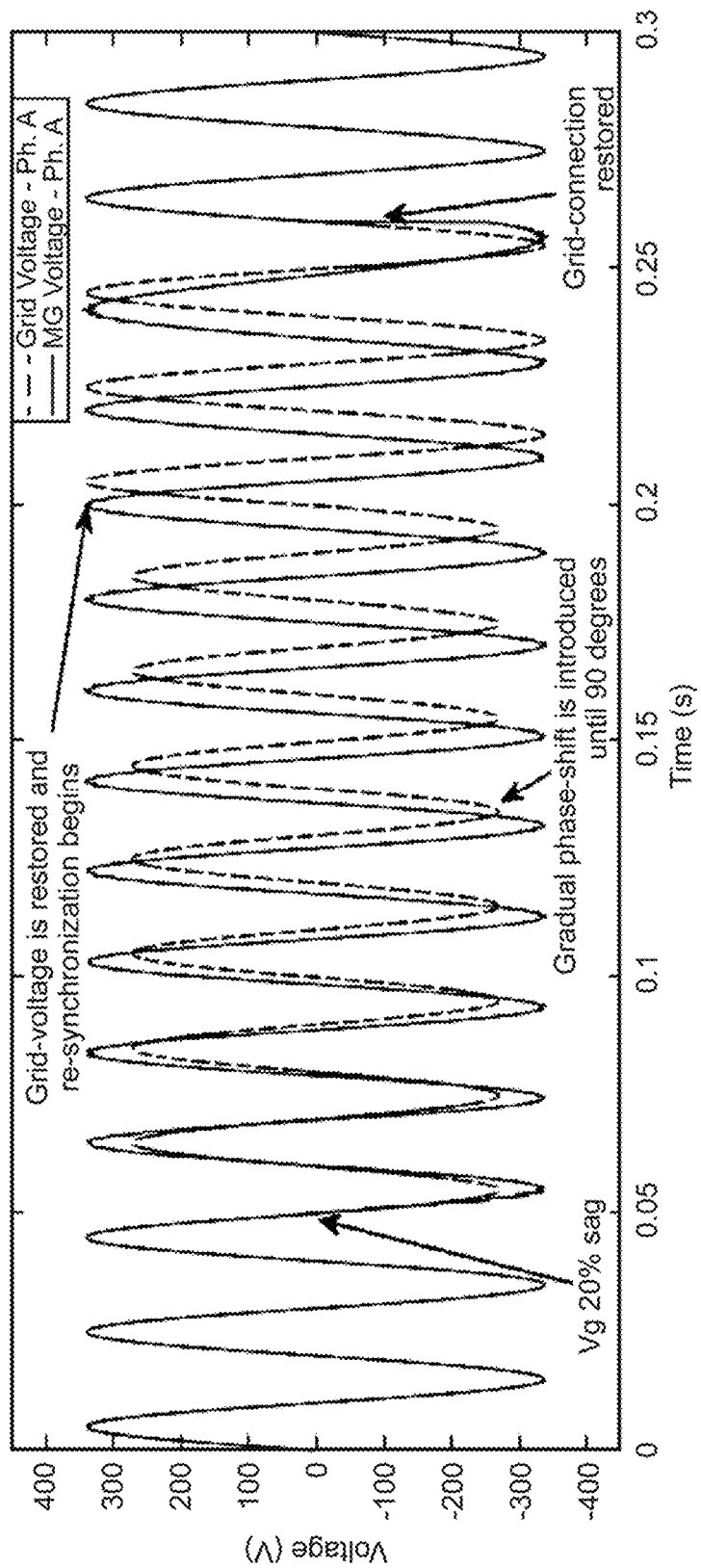
FIG. 6 illustrates a result of an example simulated test, according to certain embodiments.

FIG. 6 illustrates the result of an example simulated test, according to certain embodiments. In particular, FIG. 6 illustrates the result of an example simulated test where the islanding needs were detected at t=0.05 s when a 20% voltage sag in grid-voltage is detected with insufficient voltage support capability by the microgrid. This event may have triggered the islanding switch at the PCC to open. After that, a gradual phase-shift may be introduced to the microgrid reference PLL sinusoid until 90 degrees to create an artificial case whereby the synchronization algorithm may be tested. At t=0.2 s, the grid voltage may be restored to its 1 p.u. value and a dedicated controller may be activated after a confirmatory period (assumed around two cycles here) to adjust the microgrid phase in order to match that of the grid again. The synchronization switch may be closed once one or more of the criteria are met as per the adopted grid-code.

According to certain embodiments, the performed test may be of high relevance to the present concept as a black-start event may establish an island that may be likely to be linked to another island and/or a cluster of islands. In some embodiments, synchronization may achieve a stable operation during network restoration and the connection between different active islands, and thus, investigating the various factors affecting it may be important. The result in FIG. 6 may serve as a demonstration of the relevant capabilities developed and tested at the IBQ lab, which may be also expanded further during the proposed project course.

Unified Grid-Forming Controller with Black-Start/Virtual Inertia Support Capability Different from the grid following converters, GFCs may act as voltage sources through controlling their output voltages. Increasing the number of the grid following converters may increase the grid weakness. Therefore, the need for GFCs may increase in order to contribute to the grid voltage and frequency forming. Moreover, GFCs can contribute to black-starting, control of the rate of change of frequency, and seamlessly synchronize to weak grids. Thus, certain embodiments may provide and test a grid-forming control technique for voltage-source converters that may be capable of self-starting without a grid-based PLL signal, and that may be able to provide frequency/voltage support that mimics the behavior of synchronous generators in a way that combines the benefits of different available grid-forming controllers (e.g., matching-control, virtual synchronous machine, etc.) to limit frequency events (e.g., the RoCoF). Additionally, certain embodiments may maintain voltage stability and current limitation (converter protection) during different black-start restoration sequences and scenarios, as well as being capable of achieving a voltage-source ramp-up behavior (i.e., for transformers/lines soft energization compatibility and inrush current mitigation). According to certain embodiments, the developed controller may take into account the DC-link dynamics and the available energy buffer limitations, which may be traditionally assumed to be a stiff DC source. This may be useful under black-start scenarios that may need precise modeling and understanding of the DC side characteristics to estimate the locally available virtual inertia and the black-start support limits. According to certain embodiments, with regard to virtual inertia, the grid-connected converters may act in a similar fashion to a synchronous generator to maintain grid stability throughout the stored energy in the passive elements of the converters.

Taking the virtual inertia dynamics as an example, a frequency change fr may introduce a variation in the dc-link voltage Vdc. This, in turn, may request a change in active power P. In certain embodiments, that change in power may be considered either from a storage element or a change in the voltage across the dc-link capacitor. Correspondingly, the virtual inertia can be expressed as follows:

$$H_{vir} = \frac{1}{2} k \frac{CV_{dc}^2}{S_{rated}} \qquad (1)$$

As shown in equation (1), k may be the ratio between the maximum per unit variation in the dc-link voltage to the maximum per unit variation in the frequency, C may be the dc-link capacitance, Vdc may be the dc-link voltage, which may range from a minimum value that a converter can be linearly modulated to a maximum value considering the rated dc voltage of the converter, and $S_{rated}$ may be the base apparent power.

Certain embodiments may provide an understanding of the limits and dynamics of this relation and others for the relevant control problems in a coordinated manner. Further, according to certain embodiments, it may be possible to develop a robust controller capable of achieving successful black-start participation as requested by the system-level controller.

System Virtual Inertia Estimation and Network Clustering Algorithm for Black-Start Operation According to certain embodiments, system inertia may be affected in AC distribution networks, which may allow for fast dynamic frequency changes, consequently large frequency deviations. This may lead in turn to load shedding or large scale blackouts. In the case of having multiple converters, the expected equivalent virtual inertia may be expressed as:

$$H_{vir}^{eq} = \frac{1}{2}\sum_{i=1}^{i=N} k_i \frac{C_i V_{dc\_i}^2}{S_{rated\_i}} \quad (2)$$

Assuming almost the same dc-link voltage due to the connection of the converters to the same grid voltage level, and the same dc-link capacitors along with the same constant k (voltage change to frequency change), the equivalent inertia can be expressed as follows:

$$H_{vir}^{eq} = \frac{kC}{2}\sum_{i=1}^{i=N} \frac{V_{dc\_i}^2}{S_{rated\_i}} \quad (3)$$

According to certain embodiments, VSG operation of a group of converters and grouping them into clusters with pre-defined needs based on the control outcomes may be performed.

For instance, according to certain embodiments, in hierarchal control of AC distribution networks dominated by grid-connected converters, and in the secondary control layer, a partitioning approach of the AC distribution networks may be investigated. The AC distribution networks may be partitioned into clusters. The clusters may be arranged in terms of dynamic available equivalent virtual inertia of each cluster. In the case of black-starting, the Hanoi tower concept may be employed where the cluster that has the highest virtual inertia may be considered first. Then the next may be the cluster with the following highest inertia, and so on. Certain embodiments may provide different clustering approaches such as K-means, hierarchical, particle swarm, tabu search, fuzzy logic, genetic algorithm, etc. K-means may depend on three main parameters, namely, initialization, number of clusters, distance metric. In addition, the black start of parallel-partitioned clusters may have been achieved independently, which in turn may affect positively the needed time.

In certain embodiments, power may be restored to the cluster with the highest virtual inertia. To accomplish this, according to certain embodiments, the virtual inertia of the power converters may be estimated. According to the location of the converter in the network and the estimated virtual inertia, the network may be clustered to form different clusters with different total inertia for each cluster. According to certain embodiments, in case of a blackout, the cluster with the highest inertia may start first. Then the cluster in the neighborhood may be connected. If a third cluster will be connected (its inertia is the second highest), then it may be connected first to the cluster with the highest inertia. This may be repeated until full recovery from the blackout is achieved. In certain embodiments, the assumed network may be a network that is highly dominated by converter-based renewable energy resources. In other embodiments, the virtual inertia may support the stability of the network, and enable safe restoration from a blackout.

Network-Level Inertia Estimation

According to certain embodiments, grid forming converters may present a set of very different characteristics compared to the standard grid following converters. Parameters such as the inertia or damping may be intrinsic properties of the GFC and can be changed as easily as changing a control gain. Previous network management systems may have taken into account active and reactive power flow optimization, but other parameters can be taken into account, such as inertia. In this context, the system of certain embodiments may be incorporated with an estimation algorithm to detect and estimate the available virtual inertia/rotational inertia on a system-level and suggest a minimum needed inertia level for stable operation.

Network Clustering for Black-Start Participation Based on Available Inertia as a Reference According to certain embodiments, in hierarchal control of distribution networks dominated by grid-connected converters, and in the secondary control layer, a partitioning approach of the distribution networks may be provided. For instance, the distribution networks may be partitioned into clusters. The clusters may be arranged in terms of dynamic available equivalent virtual inertia of each cluster based on Task 4.1 inertia estimation method outcomes. In the case of black-starting, the Hanoi tower concept may be employed where the cluster that has the highest virtual inertia may be considered first. Next may be the cluster with the following highest inertia, and so on. The partitioning may be devised in terms of an optimization function (multi-objective). Additionally, the partitioning may be conducted based on maximum possible virtual inertia with the least critical loads. According to other embodiments, artificial intelligence (AI) (e.g., machine learning) may be implemented to determine the stability of the microgrid based on historical data of the microgrid and the clusters of the microgrid, and/or current or historical local environmental factors.

Simulation Case Studies to Validate the Clustering Algorithm

Figure 7A:
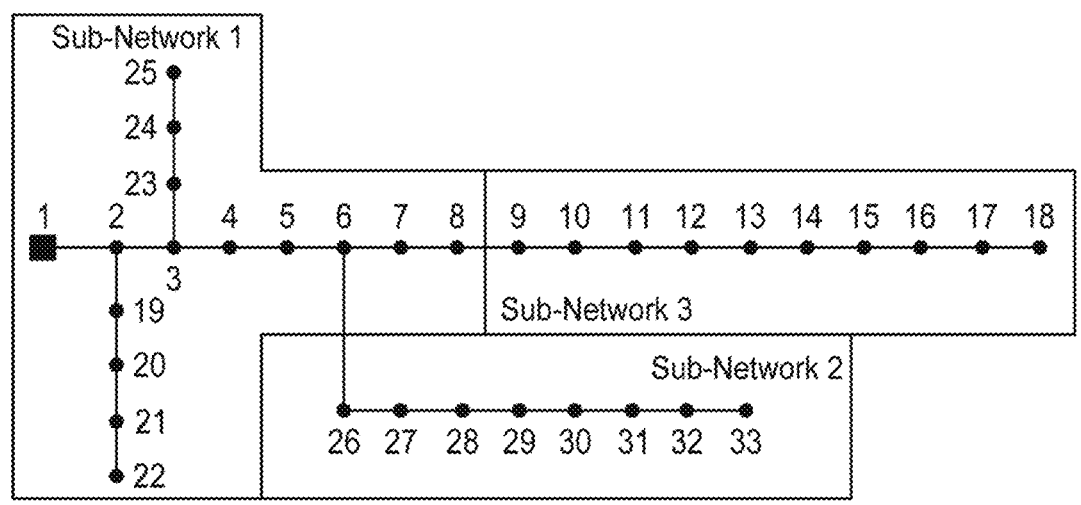
FIG. 7(a) illustrates a partitioning example, according to certain embodiments.
Figure 7B:
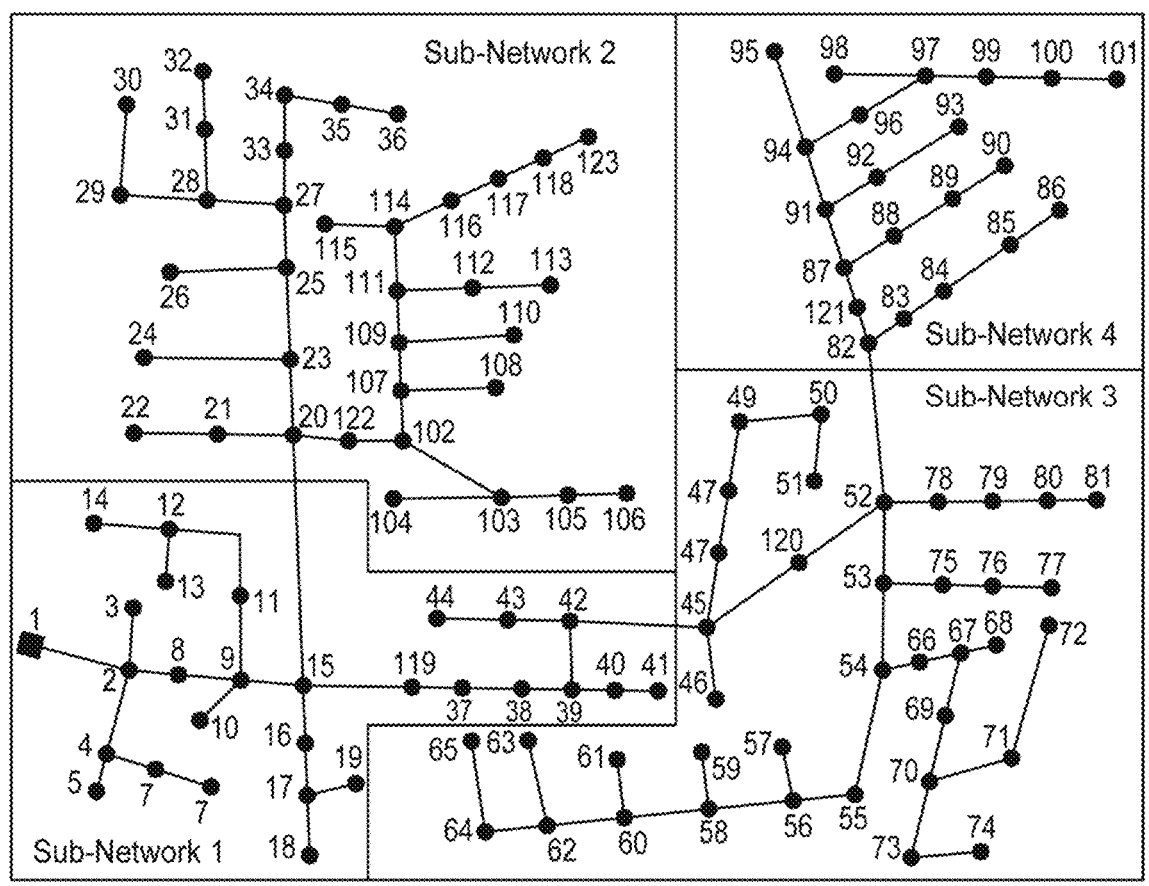
FIG. 7(b) illustrates another partitioning example, according to certain embodiments.

Case studies may be investigated using the IEEE 33-bus and IEEE 123-bus networks. An example may be shown in FIGS. 7(a) and 7(b), considering 3 clusters. Initially, there may be a static estimation of the virtual inertia according to the grid-connected converters based on their rating. Then dynamically, the virtual inertia may be calculated to retune the clusters partitioning of the distribution network. Medium voltage and low voltage network levels may be considered, addressing a wide range of distribution cable X/R ratios. The converter penetration proportions in these case studies using IEEE networks may be divided into two scenarios to reflect the time-factor represented by the increasing level of DER penetration (i.e., varying the SMs to converters ratio in the simulations to validate the algorithm capabilities against high DER penetration. Scenario 1: (2-3 years horizon) of a typical DER penetration (%) in the UK and Qatar for benchmarking, and Scenario 2: (8-10 years horizon) with further penetration (%) of converter generation.

Figure 8:
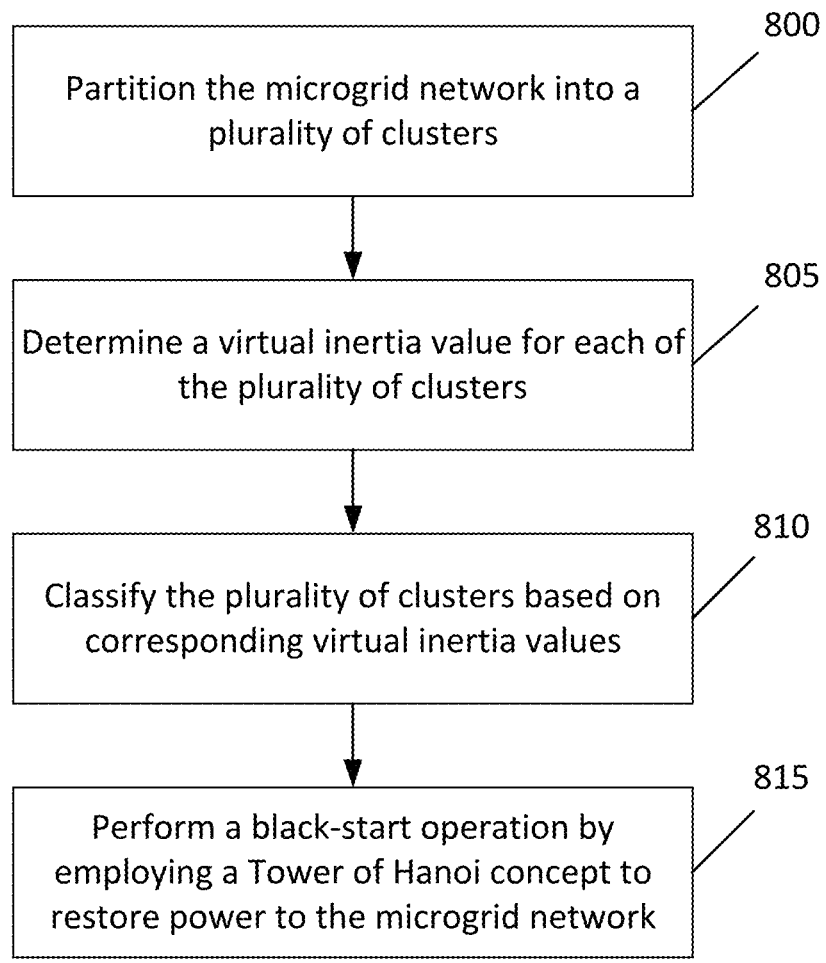
FIG. 8 illustrates a flow diagram of a method, according to certain embodiments.

FIG. 8 illustrates a flow diagram of a method, according to certain embodiments. In certain embodiments, the flow diagram of FIG. 8 may be performed by a computing device similar to apparatus 10 illustrated in FIG. 9.

According to one embodiment, the method of FIG. 8 may include, at 800, partitioning the microgrid network into a plurality of clusters. At 805, the method may also include determining a virtual inertia value for each of the plurality of clusters. At 810, the method may further include classifying the plurality of clusters based on corresponding virtual inertia values. In addition, at 815, the method may include performing a black-start operation by employing a Tower of Hanoi concept to restore power to the microgrid network. According to certain embodiments, performance of the black-start operation may take into account the virtual inertial values.

In certain embodiments, the cluster classified based on the highest virtual inertial value among all the virtual inertia values of the plurality of clusters may be identified as the cluster where the Tower of Hanoi concept is initially employed. In some embodiments, employing the Tower of Hanoi concept may include using the cluster with the highest virtual inertia to restore power in at least one other cluster with a virtual inertia lower than the cluster with the highest virtual inertia. In other embodiments, the method may further include creating a synchronization control between the plurality of clusters and the microgrid network by matching a voltage, frequency, and phase angle between each cluster and the microgrid network. According to certain embodiments, the method may also include introducing a gradual phase-shift to a phase-locked-loop sinusoid of the microgrid network until 90 degrees is reached to perform the synchronization control.

Figure 9:
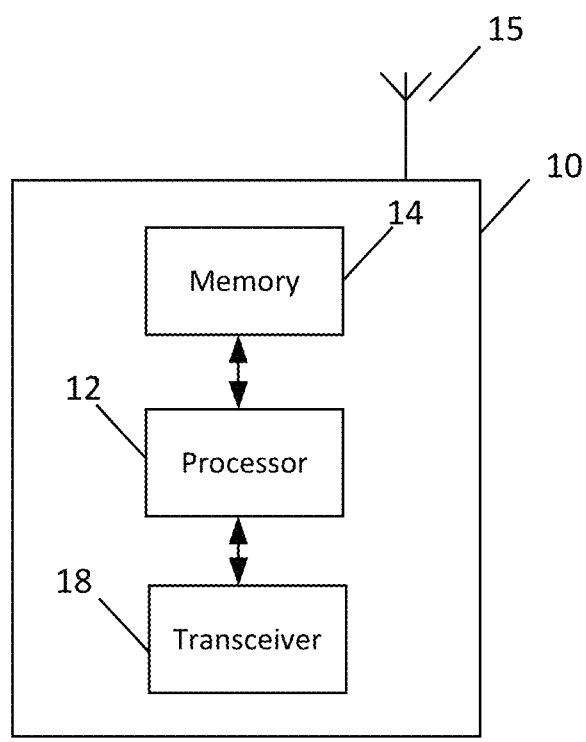
FIG. 9 illustrates an apparatus, according to certain embodiments.

FIG. 9 illustrates an apparatus according to certain embodiments. According to certain embodiments, apparatus 10 may be a computing device. As described herein, a computing device may alternatively be referred to as, for example, a computer, hardware device, mobile device, or the like.

In some example embodiments, apparatus 10 may include one or more processors, one or more computer-readable storage medium (for example, memory, storage, or the like), and/or a user interface. It should be noted that one of ordinary skill in the art would understand that apparatus 10 may include components or features not shown in FIG. 9.

As illustrated in the example of FIG. 9, apparatus 10 may include or be coupled to a processor 12 for processing information and executing instructions or operations. Processor 12 may be any type of general or specific purpose processor. In fact, processor 12 may include one or more of general-purpose computers, special purpose computers, microprocessors, digital signal processors (DSPs), field-programmable gate arrays (FPGAs), application-specific integrated circuits (ASICs), and processors based on a multi-core processor architecture, as examples. While a single processor 12 is shown in FIG. 9, multiple processors may be utilized according to other embodiments. For example, it should be understood that, in certain example embodiments, apparatus 10 may include two or more processors that may form a multiprocessor system (e.g., in this case processor 12 may represent a multiprocessor) that may support multiprocessing. According to certain example embodiments, the multiprocessor system may be tightly coupled or loosely coupled (e.g., to form a computer cluster).

Processor 12 may perform functions associated with the operation of apparatus 10 including, as some examples, precoding of antenna gain/phase parameters, encoding and decoding of individual bits forming a communication message, formatting of information, and overall control of the apparatus 10, including processes illustrated in FIGS. 1-8.

Apparatus 10 may further include or be coupled to a memory 14 (internal or external), which may be coupled to processor 12, for storing information and instructions that may be executed by processor 12. Memory 14 may be one or more memories and of any type suitable to the local application environment, and may be implemented using any suitable volatile or nonvolatile data storage technology such as a semiconductor-based memory device, a magnetic memory device and system, an optical memory device and system, fixed memory, and/or removable memory. For example, memory 14 can be comprised of any combination of random access memory (RAM), read only memory (ROM), static storage such as a magnetic or optical disk, hard disk drive (HDD), or any other type of non-transitory machine or computer readable media. The instructions stored in memory 14 may include program instructions or computer program code that, when executed by processor 12, enable the apparatus 10 to perform tasks as described herein.

In an embodiment, apparatus 10 may further include or be coupled to (internal or external) a drive or port that is configured to accept and read an external computer readable storage medium, such as an optical disc, USB drive, flash drive, or any other storage medium. For example, the external computer readable storage medium may store a computer program or software for execution by processor 12 and/or apparatus 10 to perform any of the methods illustrated in FIGS. 1-8.

In some embodiments, apparatus 10 may also include or be coupled to one or more antennas 15 for receiving a signal and for transmitting from apparatus 10. Apparatus 10 may further include a transceiver 18 configured to transmit and receive information. For instance, transceiver 18 may be configured to modulate information on to a carrier waveform for transmission by the antenna(s) 15 and demodulate information received via the antenna(s) 15 for further processing by other elements of apparatus 10. In other embodiments, transceiver 18 may be capable of transmitting and receiving signals or data directly. Additionally or alternatively, in some embodiments, apparatus 10 may include an input and/or output device (I/O device). In certain embodiments, apparatus 10 may further include a user interface, such as a graphical user interface or touchscreen.

In an embodiment, memory 14 stores software modules that provide functionality when executed by processor 12. The modules may include, for example, an operating system that provides operating system functionality for apparatus 10. The memory may also store one or more functional modules, such as an application or program, to provide additional functionality for apparatus 10. The components of apparatus 10 may be implemented in hardware, or as any suitable combination of hardware and software. According to an example embodiment, apparatus 10 may optionally be configured to communicate with other hardware elements described herein via a wireless or wired communications link.

According to certain example embodiments, processor 12 and memory 14 may be included in or may form a part of processing circuitry or control circuitry. In addition, in some embodiments, transceiver 18 may be included in or may form a part of transceiving circuitry. As discussed above, according to certain example embodiments, apparatus 10 may be a controller for example. According to certain embodiments, apparatus 10 may be controlled by memory 14 and processor 12 to perform the functions associated with example embodiments described herein. For instance, in one embodiment, apparatus 10 may be controlled by memory 14 and processor 12 to partition the microgrid network into a plurality of clusters. Apparatus 10 may also be controlled by memory 14 and processor 12 to determine a virtual inertia value for each of the plurality of clusters. Apparatus 10 may further be controlled by memory 14 and processor 12 to classify the plurality of clusters based on corresponding virtual inertia values. In addition, apparatus 10 may be controlled by memory 14 and processor 12 to perform a black-start operation by employing a Tower of Hanoi concept to restore power to the microgrid network. According to certain embodiments, performance of the black-start operation may take into account the virtual inertial values.

In some example embodiments, an apparatus (e.g., apparatus 10 and/or apparatus 20) may include means for performing a method, a process, or any of the variants discussed herein. Examples of the means may include one or more processors, memory, controllers, transmitters, receivers, and/or computer program code for causing the performance of the operations.

Certain example embodiments may be directed to an apparatus that includes means for performing any of the methods described herein including, for example, means for partitioning the microgrid network into a plurality of clusters. The apparatus may also include means for determining a virtual inertia value for each of the plurality of clusters. The apparatus may further include means for classifying the plurality of clusters based on corresponding virtual inertia values. In addition, the apparatus may include means for performing a black-start operation by employing a Tower of Hanoi concept to restore power to the microgrid network. According to certain embodiments, performance of the black-start operation may take into account the virtual inertial values.

Certain embodiments described herein provide several technical improvements, enhancements, and/or advantages. In some example embodiments, it may be possible to develop virtual inertia estimation for black-start using ToH for emerging electricity distribution networks. This unified control technique and network clustering algorithm for black-start and virtual inertia provision applications may speed up the deployment rate of renewable energy sources through exploiting the capabilities of their interface converters in alleviating the network weakening effect of traditional grid-following controllers. In other embodiments, it may be possible to provide clustering of the distribution network for other applications such as fault current issues (i.e., abnormal conditions) and power quality issues (normal conditions).

One having ordinary skill in the art will readily understand that the invention as discussed above may be practiced with steps in a different order, and/or with hardware elements in configurations which are different than those which are disclosed. Therefore, although the invention has been described based upon these example embodiments, it would be apparent to those of skill in the art that certain modifications, variations, and alternative constructions would be apparent, while remaining within the spirit and scope of example embodiments.

We claim:

1. A method for managing a microgrid network under a blackout condition, comprising:
    partitioning the microgrid network into a plurality of clusters;
    determining a virtual inertia value for each of the plurality of clusters;
    classifying the plurality of clusters based on corresponding virtual inertia values; and
    performing a black-start operation by employing a Tower of Hanoi concept to restore power to the microgrid network, wherein performance of the black-start operation takes into account the virtual inertial values.

2. The method for managing the microgrid network under the blackout condition according to claim 1, wherein the cluster classified based on the highest virtual inertial value among all the virtual inertia values of the plurality of clusters is identified as the cluster where the Tower of Hanoi concept is initially employed.

3. The method for managing the microgrid network under the blackout condition according to claim 2, wherein employing the Tower of Hanoi concept comprises using the cluster with the highest virtual inertia to restore power in at least one other cluster with a virtual inertia lower than the cluster with the highest virtual inertia.

4. The method for managing the microgrid network under the blackout condition according to claim 1, further comprising:
    creating a synchronization control between the plurality of clusters and the microgrid network by matching a voltage, frequency, and phase angle between each cluster and the microgrid network.

5. The method for managing the microgrid network under the blackout condition according to claim 4, further comprising:
    introducing a gradual phase-shift to a phase-locked-loop sinusoid of the microgrid network until 90 degrees is reached to perform the synchronization control.

6. A apparatus for managing a microgrid network under a blackout condition, comprising:
    at least one processor; and
    at least one memory including computer program code,
    wherein the at least one memory and the computer program code are configured, with the at least one processor, cause the controller at least to:
    partition the microgrid network into a plurality of clusters;
    determine a virtual inertia value for each of the plurality of clusters;
    classify the plurality of clusters based on corresponding virtual inertia values; and
    perform a black-start operation by employing a Tower of Hanoi concept to restore power to the microgrid network, wherein performance of the black-start operation takes into account the virtual inertial values.

7. The apparatus for managing the microgrid network under the blackout condition according to claim 6, wherein the cluster classified based on the highest virtual inertial value among all the virtual inertia values of the plurality of clusters is identified as the cluster where the Tower of Hanoi concept is initially employed.

8. The apparatus for managing the microgrid network under the blackout condition according to claim 7, wherein employing the Tower of Hanoi concept comprises using the cluster with the highest virtual inertia to restore power in at least one other cluster with a virtual inertia lower than the cluster with the highest virtual inertia.

9. The apparatus for managing the microgrid network under the blackout condition according to claim 6, wherein the at least one memory and the computer program code are further configured, with the at least one processor, cause the controller at least to:
create a synchronization control between the plurality of clusters and the microgrid network by matching a voltage, frequency, and phase angle between each cluster and the microgrid network.

10. The apparatus for managing the microgrid network under the blackout condition according to claim 9, wherein the at least one memory and the computer program code are further configured, with the at least one processor, cause the controller at least to:
introduce a gradual phase-shift to a phase-locked-loop sinusoid of the microgrid network until 90 degrees is reached to perform the synchronization control.

11. A computer program, embodied on a non-transitory computer readable medium, the computer program, when executed by a processor, causes the processor to:
partition a microgrid network under a blackout condition into a plurality of clusters;
determine a virtual inertia value for each of the plurality of clusters;
classify the plurality of clusters based on corresponding virtual inertia values; and
perform a black-start operation by employing a Tower of Hanoi concept to restore power to the microgrid network, wherein performance of the black-start operation takes into account the virtual inertial values.

12. The computer program according to claim 11, wherein the cluster classified based on the highest virtual inertial value among all the virtual inertia values of the plurality of clusters is identified as the cluster where the Tower of Hanoi concept is initially employed.

13. The computer program according to claim 12 wherein employing the Tower of Hanoi concept comprises using the cluster with the highest virtual inertia to restore power in at least one other cluster with a virtual inertia lower than the cluster with the highest virtual inertia.

14. The computer program according to claim 11, wherein the processor is further caused to:
create a synchronization control between the plurality of clusters and the microgrid network by matching a voltage, frequency, and phase angle between each cluster and the microgrid network.

15. The computer program according to claim 14, wherein the processor is further caused to:
introduce a gradual phase-shift to a phase-locked-loop sinusoid of the microgrid network until 90 degrees is reached to perform the synchronization control.

\* \* \* \* \*